(12) United States Patent
Wen et al.

(10) Patent No.: US 11,016,147 B2
(45) Date of Patent: May 25, 2021

(54) INTELLIGENT MONITORING SYSTEM AND METHOD FOR ENERGY SWITCH ACCESSORY DEVICE

(71) Applicant: Beijing University of Posts and Telecommunications, Beijing (CN)

(72) Inventors: Xiangming Wen, Beijing (CN); Jinlong Mi, Beijing (CN); Chunlei Sun, Beijing (CN); Zhaoming Lu, Beijing (CN); Yan Tian, Beijing (CN); Jingyi Zhang, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 229 days.

(21) Appl. No.: 16/209,760

(22) Filed: Dec. 4, 2018

(65) Prior Publication Data
US 2020/0041566 A1 Feb. 6, 2020

(30) Foreign Application Priority Data

Aug. 3, 2018 (CN) .......................... 201810883188.7

(51) Int. Cl.
*G01R 31/327* (2006.01)
*H04W 4/38* (2018.01)
*H03K 17/965* (2006.01)

(52) U.S. Cl.
CPC ......... *G01R 31/327* (2013.01); *H03K 17/965* (2013.01); *H04W 4/38* (2018.02)

(58) Field of Classification Search
CPC ..... G01R 31/327; G01R 22/063; H04W 4/38; H04W 4/80; H03K 17/965; Y04S 40/126; H02J 13/0075; H02J 13/0005; H04L 12/2809
See application file for complete search history.

(56) References Cited

U.S. PATENT DOCUMENTS

| 2014/0088738 A1* | 3/2014 | Kouda ................. G04G 15/006 700/90 |
| 2014/0195064 A1* | 7/2014 | Lim .................... H04L 12/2827 700/298 |
| 2015/0253364 A1* | 9/2015 | Hieda ...................... H04Q 9/00 702/62 |
| 2016/0266183 A1* | 9/2016 | Park ..................... G01R 21/133 |

OTHER PUBLICATIONS

B. Mrazovac, M. Z. Bjelica, N. Teslic and I. Papp, "Towards ubiquitous smart outlets for safety and energetic efficiency of home electric appliances," 2011 IEEE International Conference on Consumer Electronics-Berlin (ICCE-Berlin), Berlin, 2011, pp. 322-326 (Year: 2011).*

Heartbeat (computing), available at https://web.archive.org/web/20180924224513/https://en.wikipedia.org/wiki/Heartbeat_(computing) on May 31, 2018 (Year: 2018).*

\* cited by examiner

*Primary Examiner* — Daniel R Miller
(74) *Attorney, Agent, or Firm* — Seed IP Law Group LLP

(57) ABSTRACT

The present disclosure discloses an intelligent monitoring system for an energy switch accessory device, comprising a smart device monitoring unit, a data processing unit, and a data storage unit. A wireless connection and a physical connection of a device are separately checked. Electrical information of a device is obtained through the physical connection. A device is categorized as an ordinary device if the wireless connection of with the device is disconnected while the physical connection with the device is maintained.

9 Claims, 3 Drawing Sheets

INTELLIGENT MONITORING SYSTEM AND METHOD FOR ENERGY SWITCH ACCESSORY DEVICE

BACKGROUND

Technical Field

The present disclosure relates to the field of energy and computer, and in particular, to an intelligent monitoring system and method for an energy switch accessory device.

Description of the Related Art

The energy switch is an important device in energy networks. The energy switch is suitable for device monitoring and control, such as measurement, protection, monitoring, communication, access control and management. The energy switch is also suitable for power energy exchange, such as energy exchange and utilization among plug-and-play power generating/consuming devices in a main-grid system. The energy switch is also suitable for malfunction alerts, for example, informing the user when there are malfunctions such as island, overvoltage, overcurrent or short circuit inside the main-grid. The energy switch is also suitable for maintenance and management of operation information, such as system configuration, equipment parameters, operation and maintenance information, etc., in the main-grid.

At present, the monitoring of energy devices is limited to the monitoring by use of electrical information. A disadvantage is that this monitoring can only monitor whether a device is connected to an access port, but cannot obtain specific device information, which limits the intelligent monitoring of the device. For example, it is difficult to visualize the topology and specifications of the connected device or perform specific energy management for different devices.

BRIEF SUMMARY

The present disclosure provides an intelligent monitoring system and method for an energy switch accessory device.

According to an aspect of the present disclosure, there is an intelligent monitoring system provided for monitoring accessory devices associated with an energy switch. The intelligent monitoring system comprises a smart device monitoring unit, a data processing unit, and a data storage unit. The smart device monitoring unit is configured for establishing a wireless communication connection with a smart device, receiving device electrical information from the smart device, and sending the device electrical information to the data processing unit. The data processing unit is configured for, based on the received device electrical information: checking each of the plurality of access ports to determine whether any of the access ports is connected to a device based on whether a current is detected in the access port; determining whether the data for the access port, in which the current is detected, has been updated within a certain time period; determining whether the current in the access port matches a rated current of the smart device if the data for the access port has been updated within the certain time period; and determining that the device connected to the access port is the smart device if the current in the access port matches the rated current of the smart device. The data storage unit is configured for one or more of updating or storing data based on the received check result of the data processing unit and the device electrical information.

According to another aspect of the present disclosure, there is an intelligent monitoring method provided for monitoring accessory devices associated with an energy switch. The method comprises Step 1, Step 2, and Step 3. The Step 1 comprises establishing a wireless communication connection between an energy switch and a smart device, receiving device electrical information from the smart device, and sending the device electrical information to a data processing unit. Step 2 comprises, by the data processing unit, checking each of the plurality of access ports to determine whether any of the access ports is connected to a device based on whether a current is detected in the access port; determining whether the data for the access port, in which the current is detected, has been updated within a certain time period; determining whether the current in the access port matches a rated current of the smart device if the data for the access port has been updated within the certain time period; and determining that the device connected to the access port is the smart device if the current in the access port matches the rated current of the smart device. Step 3 comprises one or more of updating or storing data in the data storage unit based on the received check result and the device electrical information.

According to embodiments of the present disclosure, the electrical data of the connected device collected by the energy switch and device information and heartbeat message sent by the smart device through wireless communication are used for online and offline monitoring of the device. On the other hand, for ordinary devices without a wireless communication unit, information collected by the energy switch can be used for online and offline determination.

BRIEF DESCRIPTION OF THE SEVERAL VIEWS OF THE DRAWINGS

The accompanying drawings are described briefly in order to more clearly describe the technical solutions in the embodiments of the present disclosure or in the related art. Obviously, the accompanying drawings described below are merely some embodiments recited in the present disclosure. Other embodiments will be readily apparent to those skilled in the art in light of these accompanying drawings.

DETAILED DESCRIPTION

The embodiments of the present disclosure are described in detail below with reference to the accompanying drawings. Obviously, the described embodiments are merely some embodiments of the present disclosure. Other embodiments will be readily apparent to those skilled in the art in light of the described embodiments. All these embodiments fall within the protection scope of the present disclosure. In the following description, some techniques that are not essential to the present disclosure are described only briefly or omitted.

Figure 1:
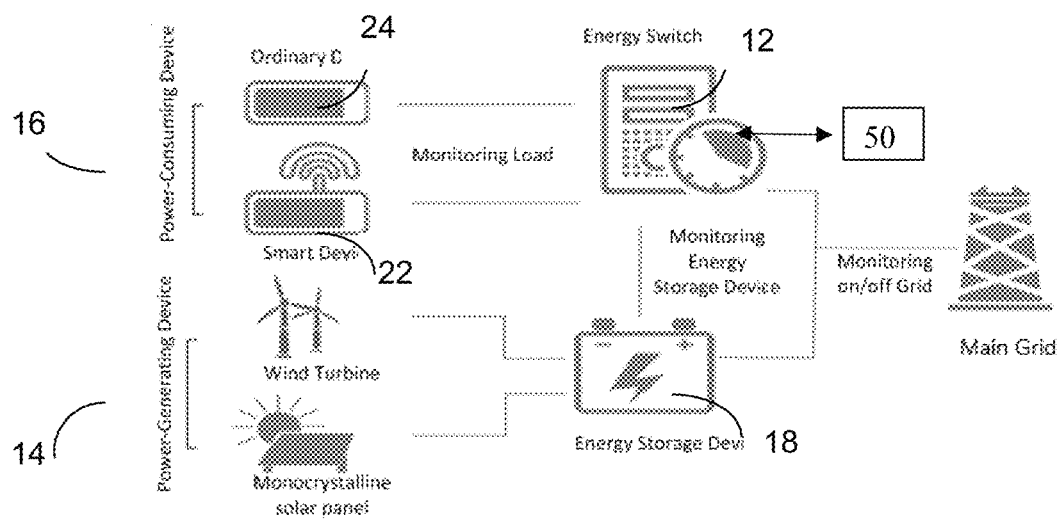
FIG. 1 shows an application scenario of an intelligent monitoring system for an energy switch accessory device according to embodiments of the present disclosure.

FIG. 1 shows an application environment 10 of an accessory device intelligent monitoring system 10 of an energy switch according to embodiments of the present disclosure. The environment 10 includes an energy switch 12 as an example core equipment, which can be connected to accessory devices such as power-generating devices 14, e.g., wind turbines or monocrystalline solar panels; power-consuming devices 16, e.g., smart or connected devices 22 or an ordinary power-consuming devices 24; and energy storage devices 18. A smart or connected device 22 refers to a device that is, or is capable of being, connected to another device through data communication. An ordinary power consumption device 24 refers to a device that is not, or is not capable of being, connected to another device through data communication. Note that a specific device may be categorized into a connected device 22 or an ordinary power-consuming device 24, depending on the operation state/mode of the device. For example, an otherwise smart appliance like a smart refrigerator may be categorized as an ordinary power consuming device when its data communication functions are turned off, e.g., in the situations of WiFi off. The energy switch 12 according to the present disclosure, is capable of performing online and offline detecting of these devices. Online and offline detection and energy management of smart devices can be performed through data interaction using wireless communication (e.g., WiFi) in accordance with the TCP/IP communication protocol. Online and offline detection of ordinary devices can be performed by monitoring electrical information at access ports in turn. Commercial WiFi devices can provide run-time data of load devices to the energy switch in substantially real time or periodically.

The accessory devices mentioned in the present disclosure may be power-consuming devices, energy storage devices, power-generating devices, or the like that are connected to the energy switch. Several types of accessory devices are listed for illustration. Any type of accessory devices that can be connected to the energy switch and monitored by the solution of the present disclosure fall within the scope of the present disclosure.

The accessory devices according to embodiments of the present disclosure may be smart devices 22 or ordinary devices 24. The smart device 22 includes a wireless or wired communication unit (e.g., a WiFi unit, a Bluetooth unit, or a ZigBee unit) and can exchange information with the energy switch 12 using the wireless communication unit. The ordinary device 24 may not include such a wireless or wired communication unit or may not operate with such a wireless or wired communication unit, if any.

In an embodiment, an accessory device intelligent monitoring system 50 is coupled to, and functions together with, the energy switch 12. The accessory device intelligent monitoring system 50 may be part of the energy switch 12 or may be a standalone system and coupled to the energy switch 12 through one or more of electrical signal communication or data signal communication. For example, the accessory device intelligent monitoring system 50 may be a plug-in application that resides locally with the energy switch 12. In another example, the accessory device intelligent monitoring system 50 may be a cloud-based application and function with the energy switch through a distributed computing environment.

The accessory device intelligent monitoring system 50 may communicate with other units of the environment 10 through the energy switch 12 or in parallel with the energy switch 12. In the description herein, the description may include either one or both the energy switch 12 or the system 50 in the communication with other units of the environment 10, which are for descriptive purposes only and do not limit the scope of the disclosure. That is, the described communication between the energy switch 12 with a third-party unit, e.g., a smart device 22, may also be conducted between the system 50 or components thereof with the third-party unit. Similarly, the described communication between the system 50 or the components thereof with a third-party unit, e.g., a smart device 22, may also be conducted between the energy switch 12 with the third-party unit.

Figure 2:
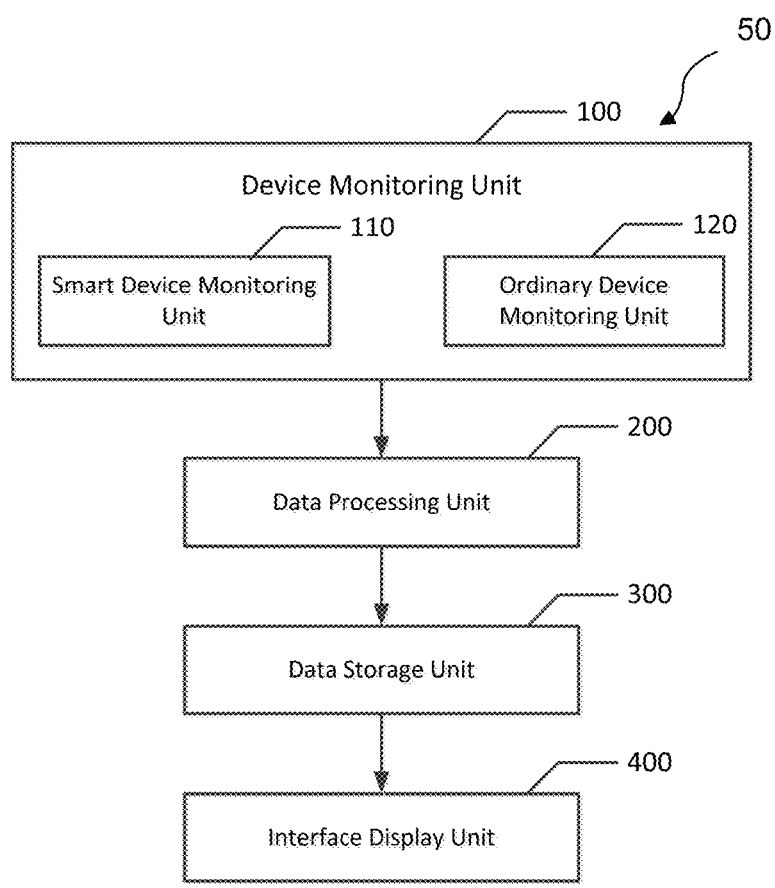
FIG. 2 shows a structural block diagram of an intelligent monitoring system for an energy switch accessory device according to embodiments of the present disclosure.

As shown in FIG. 2, according to example embodiments of the present disclosure, the accessory device intelligent monitoring system 50 ("system 50") for an energy switch 12 includes a device monitoring unit 100, a data processing unit 200, a data storage unit 300, and an interface display unit 400. In an embodiment, all the components of the system 50 are arranged in the energy switch 12. In another example, one or more of the components of the system 50 reside remotely with respect to the energy switch 12 and are coupled to the energy switch 12 and/or other components of the system 50 remotely through data or electrical signal communications.

The device monitoring unit 100 is configured for monitoring online and/or offline behavior of a smart device 22 and/or an ordinary device 24. The device monitoring unit 100 may include a smart device monitoring unit 110 and an ordinary device monitoring unit 120.

The smart device monitoring unit 110 is configured for, among others, monitoring a communication connection, which may be established when a smart device 22 is connected to the energy switch 12, at a preset port of the energy switch. The smart device 22 sends device authentication information when the smart device 22 is connected to the energy switch 12 via a wireless communication unit using, e.g., WiFi. The authentication information may include "$energy devices$," which is sent by each smart device 22 after it establishes a communication connection with the energy switch. The energy switch sends back confirmation information if the smart device 22 passes authentication. The confirmation information may also include "$energy device$," which indicates that the smart device 22 is an accessory device. Then subsequent operations can be performed.

The energy switch 12 receives the authentication information and authenticates the smart device 22 using the smart device monitoring unit 110. The energy switch 12 maintains a communication connection, e.g., a socket connection, with the smart device 22 after the smart device 22 passes the authentication and the confirmation information is sent to the smart device 22. The smart device 22 sends device electrical information of the smart device 22 to the smart device monitoring unit 110 after receiving the confirmation information. The device electrical information includes a device name, a rated voltage, a rated current, and information indicating whether energy management is required. The smart device monitoring unit 110 disconnects the wireless communication connection with the smart device 22 if it determines the wireless communication connection, e.g., the WiFi connection, is illegal and resumes monitoring for other communication connections. The smart device monitoring unit 110 packets the device electrical information received from the smart device 22 into a data packet and sends the data packet to the data processing unit 200. The smart device monitoring unit 110 can operate in a multithreading manner. The smart device monitoring unit 110 starts a new thread for a connection after it monitors the connection. Meanwhile, other connections can be monitored and a plurality of wireless connections can be maintained in the same time.

The data processing unit 200 checks each of a plurality of access ports of the energy switch 12 in turn after receiving the device electrical information sent by the smart device monitoring unit 110 to determine whether the smart device 22, which has established the wireless communication, also establishes a physical connection, and to determine the access port of the physical connection.

The smart device 22 establishes the physical connection with a certain access port of the energy switch 12 when it accesses the energy switch 12, causing voltage and current changes in this access port. The smart device 22 establishes the wireless communication connection, e.g., the WiFi connection, with the energy switch 12 after the physical connection has been established and sends the device electrical information. The energy switch 12 checks each access port in turn to search for at least one access port, in which the voltage and current change within a short time interval, e.g., 2 seconds, before the wireless communication connection is established using the data processing unit 200. The data processing unit 200 then compares the electrical information for the at least one access port with the rated electrical information of the smart device 22 to find the access port in which the voltage and current change within the time interval matches the rated current of the smart device 22.

In an embodiment, the communication connection and the physical connection between the smart device 22 and the energy switch 12 are separate. The energy switch 12 does not know which access port for the physical connection corresponds to the communication connection after the communication connection is established. On the other hand, the energy switch 12 does not know which communication connection corresponds to the physical connection after the physical connection is established. Therefore, the data processing unit 200 performs the check. According to embodiments of the preset disclosure, the data processing unit 200 checks the access ports in turn after receiving the device electrical information from the smart device monitoring unit 110. The data processing unit 200 first check the current in the access ports. The access port is not connected to any accessory device if the current in the access port is zero. The access port is connected to an accessory device if the current in this access port is not zero. For access ports in which the current is not zero, the update time of the data for the access ports are checked. In the case where the time interval from the last update time of the data for the access port to the check time is shorter than a predetermined time interval, a comparison is performed between the actual current in the access port and the rated current information received from the smart device 22. The device connected to the access port is determined to be the smart device 22 just connected, e.g., through WiFi, if the actual current in the access port matches the rated current information. The device connected to the access port is not determined to be the smart device 22 just connected if the actual current in the access port does not match the rated current information. The device connected to the access port is not determined to be the smart device 22 just connected if the time interval from the last update time of the data for the access port to the check time is longer than the predetermined time interval.

The predetermined time interval is a preset threshold value related to a time from power-on (e.g., to establish the physical connection to a certain access port) of the smart device 22 to establishment of the communication connection. The accuracy of the check result of the data processing unit 200 increases as the threshold value becomes smaller. For example, in the case where the threshold value is set to 2 seconds, the current in the access port is compared with the rated current information received from the smart device 22 if the current in the access port is not zero and the current changes within 2 seconds from the check time. The accessory device connected to the access port is determined to be the smart device 22 if the current in the access port matches the rated current information. On the other hand, the accessory device connected to the access port is not determined to be the smart device 22 just connected if the current in the access port is not zero but the current changes before 2 seconds from the check time. The case where the time interval from the last update time of the data for the access port to the check time is longer than the predetermined time interval is usually because the connected device is recognized as an ordinary device 24 or the smart device 22 is not physically connected to the energy switch 12.

The data processing unit 200 checks each access port in turn in a same manner. The data processing unit 200 determines whether there is a device connected to the access port based on whether the current in the access port is zero. The data processing unit 200 determines whether the access port is connected to the smart device 22 based on whether the time interval from the last update time of the data for the access port to the check time is shorter than the predetermined time interval and whether the current in the access port matches the rated current information sent by the smart device 22.

The data processing unit 200 may send a check result to the data storage unit 300. The check result may include an access port ID and the device electrical information.

The smart device 22 sends a heartbeat message periodically after it establishes the wireless communication with the energy switch 12. The heartbeat message includes a device ID and a port number of the access port for the device. The smart device monitoring unit 110 of the energy switch 12 receives the heartbeat message. It is determined that the smart device 22 has disconnected the wireless communication connection, e.g., the WiFi connection, if the smart device monitoring unit 110 fails to receive the heartbeat message within a preset time period. The smart device monitoring unit 110 sends the access port ID of the access port to the data processing unit 200. The data processing unit 200 determines if the device connected to the access port has disconnected, i.e., has disconnected the physical connection. The data processing unit 200 informs the data storage unit 300 if the device has disconnected. The data storage unit 300 updates an online device list by removing an online record of the device and adds an offline record of the device in a device information database. In the case where the device only disconnects the wireless communication, e.g., the WiFi connection, but does not disconnect the physical connection, the record of the device in the online device list is updated to an ordinary online device and the disconnection of the wireless communication, e.g., the offline record of WiFi connection, is recorded in the device information database.

The ordinary device monitoring unit 120 is configured for monitoring ordinary devices 24. The ordinary device 24 may be a device without a communication unit, such as a display screen, a refrigerator, or a washing machine. The ordinary device monitoring unit 120 reads each access port of the energy switch 12 periodically and collects electrical information. The information is collected from the access ports because the ordinary device 24 does not have the communication unit. The collected electrical information includes actual voltage and current in the access port, a time point when the current changes (i.e., the time point when the device comes online), and an access port ID of the device. Ordinary devices 24 are generally named as "ordinary device" in the online device list in the data storage unit 300. For the smart device 22, the electrical information includes its actual voltage and current, a time point when the current changes (i.e., the time point when the device comes online), the access port ID of the device, the rated voltage and current, the device name, and information indicating whether energy management is required and is received via the communication connection.

The ordinary device monitoring unit 120 sends the collected information to the data processing unit 200. The data processing unit 200 compares the information received from the ordinary device monitoring unit 120 with the online device list in the data storage unit 300 and updates information that has changed. For example, in the case where a number of devices connected to the access ports is less or greater than a number of devices recorded in the online device list, it can be determined that there are ordinary devices 24 coming online or going offline and the data processing unit 200 updates the online device list in the data storage unit 300 based on the access port ID and electrical information corresponding to the ordinary devices 24 that come online, e.g., are connected to access ports, or to offline, e.g., are disconnected from access ports. In the case where the number of devices connected to the access ports is equal to the number of devices recorded in the online device list, the information may or may not have changed. Then it should be determined whether to update the online device list according to actual situation.

According to embodiments of the present disclosure, the ordinary device monitoring unit 120 checks the access ports in turn and goes through the online device list when monitoring the access ports. It is determined that a new ordinary device 24 comes online if an access port having non-zero current is not in the online device list. It is determined that a device connected to an access port recorded in the online device list goes offline if the current in the access port is zero.

According to embodiments of the present disclosure, the data processing unit 200 is configured for reading and analyzing data, reading and writing the data storage unit 300, and performing energy management of the device according to data processing result. For example, the data processing unit 200 reads the online device list from the data storage unit 300 and reads the electrical information collected at the access ports from the device monitoring unit 100. The data processing unit 200 analyzes the device information sent by the smart device 22. The data processing unit 200 compares the online device list read from the data storage unit 300 with the information collected at the access ports by the device monitoring unit 100 and writes updated online device list information into the data storage unit 300. The data processing unit 200 writes records of smart devices 22 into the device information database of the data storage unit 300 when the smart devices 22 get online or go offline.

The data storage unit 300 includes the online device list and the device information database. The online device list includes real-time online information of the smart devices 22 and ordinary devices 24 that have established physical connections with the energy switch 12. For the smart device 22, the online device list includes the device name, the rated electrical information of the device, information indicating whether energy management is required, the energy management strategy, etc. For the ordinary device 24, the online device list includes the access port ID of the access port connected with the device, the voltage and current information collected at the access port, and the time when the information collected at the access port changes. The device information database includes the online and offline records of respective smart devices 22 so that history records can be retrieved conveniently.

According to embodiments of the present disclosure, the interface display unit 400 may operate in a B/S mode to display device monitoring status via a web page and provide energy management switches for the access ports. In this way, a user can manage the accessory devices, e.g., charging devices, on the web page conveniently. According to embodiments of the present disclosure, the user needs to log in via a log-in interface before using the system. The online device list in the data storage unit 300 can be displayed on the web page.

Figure 3:
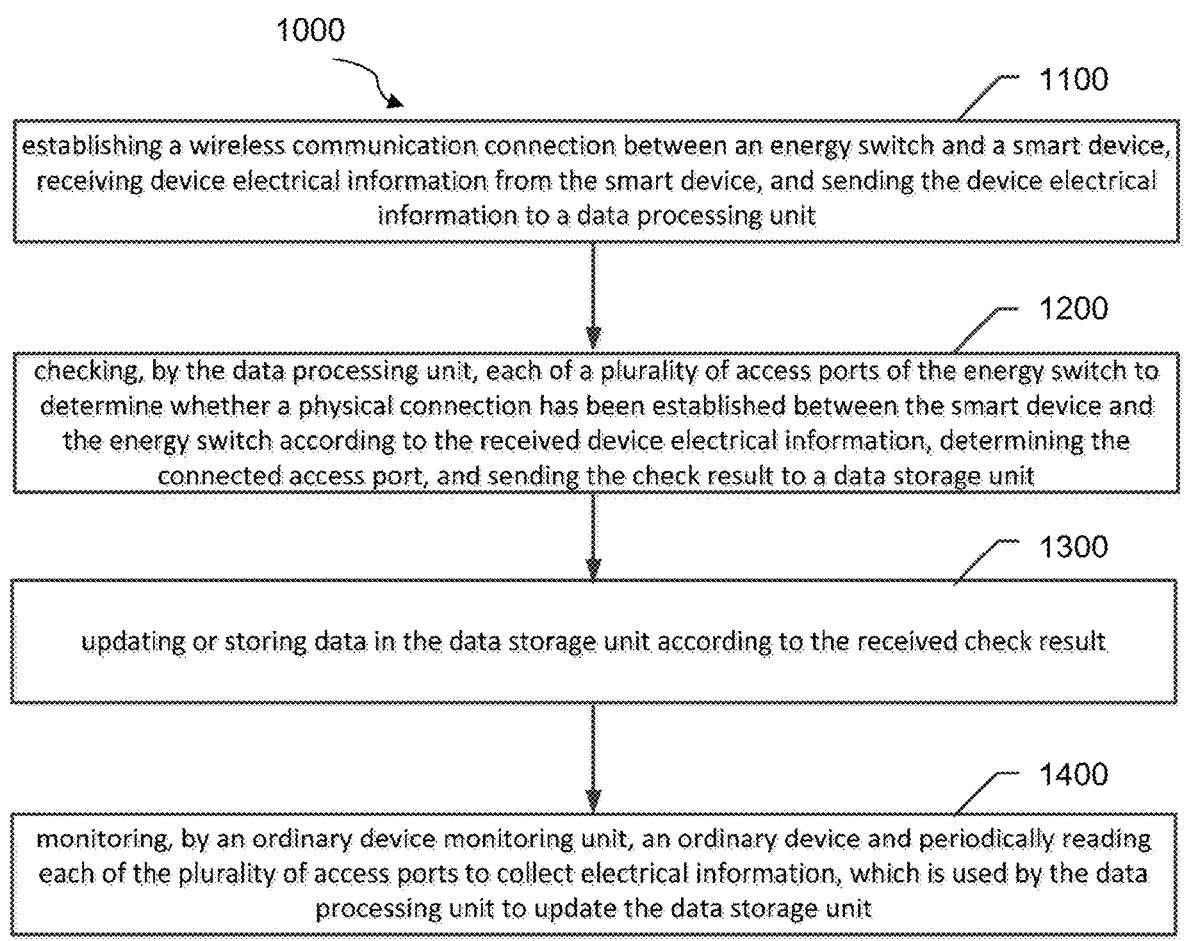
FIG. 3 schematically shows a flow chart of an intelligent monitoring method for an energy switch accessory device according to embodiments of the present disclosure.

As shown in FIG. 3, the present disclosure also provides an intelligent monitoring method 1000 for an energy switch 12 accessory device comprising the following steps.

In example operation 1100, a wireless communication connection is established between an energy switch 12 and a smart device 22, and device electrical information is received by the energy switch 12 from the smart device 22 and sent to a data processing unit.

This example operation further includes receiving, by a smart device monitoring unit 110, authentication information from the smart device 22 and receiving the device electrical information if the smart device 22 passes the authentication. The device electrical information includes a device name, a rated voltage, a rated current, and information indicating whether energy management is required.

In example operation 1200, the data processing unit 200 checks each of a plurality of access ports of the energy switch 12 to determine whether a physical connection has been established between the smart device 22 and the energy switch 12 according to the received device electrical information, determines the connected access port, and sends the check result to a data storage unit.

Example operation 1200 further includes, after the smart device monitoring unit 110 receives the device electrical information, checking each of the plurality of access ports in turn to determine whether any of the access ports is connected to a device according to whether a current is detected in the access port; determining whether the data for the access port, in which the current is detected, has been updated within a certain time period; determining whether the current in the access port matches a rated current of the smart device 22 if the data for the access port has been updated within the certain time period; and determining that the device connected to the access port is the smart device 22 if the current in the access port matches the rated current of the smart device 22.

Example operation 1200 further includes: receiving, by the smart device monitoring unit, a heartbeat message dispatched periodically from the smart device 22, and determining that the smart device 22 has disconnected the wireless communication connection if the heartbeat message has not been received after a predetermined time interval; determining, by the data processing unit, whether the smart device 22 has disconnected the physical connection; if it is determined that the smart device 22 has disconnected the wireless communication connection, recording, by the data processing unit, the smart device 22 as being offline in the data storage unit if the smart device 22 has disconnected the physical connection; and updating, by the data processing unit, the smart device 22 as an ordinary online device in the data storage unit if the smart device 22 disconnected the wireless communication connection, but does not disconnect the physical connection.

In example operation 1300, the data storage unit 300 updates or stores data according to the received check result.

In example operation 1400, an ordinary device monitoring unit 120 monitors an ordinary device 24 and periodically reads each of the plurality of access ports to collect electrical information, which is used by the data processing unit to update the data storage unit.

The foregoing method can be implemented by the intelligent monitoring system for the energy switch 12 accessory device as described above with reference to the embodiments of the present disclosure. Therefore, duplicate contents are omitted in the description of the method.

Embodiments of the present disclosure can be suitable for the following application scenario. The power-consuming devices may include any of a mobile phone, a computer, a television, a washing machine, a refrigerator, or an electric vehicle. The power-generating device may include a solar-energy photovoltaic panel. In good weather conditions, the photovoltaic panel generates power and stores the power in an energy storage device 18. Meanwhile, the computer, the mobile phone, and the electric vehicle, etc., need to be charged via the energy switch 12. The energy switch 12 identifies a device when the device is connected and recognizes it as a smart device 22 or an ordinary device 24 and identifies a topology of the connected device. After the device has finished charging and the energy switch 12 recognizes that a communication unit of the device or the device becomes offline, the energy switch 12 removes the device from its online device list.

The object, technical solution, and effects of the present disclosure have been illustrated with reference to the foregoing embodiments. However, the foregoing description is ONLY embodiments of the present disclosure and does not constitute any limitation thereto. Any alteration, equivalent substitution, or modification within the spirit and principle of the present disclosure fall within the protection scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An intelligent monitoring system for an energy switch, comprising a smart device monitoring unit, a data processing unit, and a data storage unit, wherein:
the smart device monitoring unit is configured for:
establishing a wireless communication connection with a smart device;
receiving device electrical information from the smart device; and
sending the device electrical information to the data processing unit;
the data processing unit is configured for, based on the received device electrical information:
checking each of a plurality of access ports of the energy switch to determine whether an access port of the plurality access ports is physically connected to a device based on whether a current is detected in the access port;
determining whether a data for the access port, in which the current is detected, has been updated within a threshold time period after the current is detected, the threshold time period being specifically set for the smart device;
determining whether the detected current in the access port matches a rated current of the smart device in response to that the data for the access port has been updated within the threshold time period; and
determining that the device connected to the access port is the smart device in response to that the current in the access port matches a rated current of the smart device; and
the data storage unit is configured for updating or storing data according to the received check result and the device electrical information.

2. The system according to claim 1, wherein:
the smart device monitoring unit is configured for receiving authentication information from the smart device, and receiving the device electrical information in response to that the smart device passes the authentication; and
the device electrical information comprises a device name, a rated voltage, a rated current, and information indicating whether energy management is required.

3. The system according to claim 1, wherein:
the smart device monitoring unit is further configured for periodically receiving a heartbeat message from the smart device after establishing the wireless communication connection with the smart device, and determining that the smart device has disconnected the wireless communication connection in response to that the heartbeat message has not been received after a threshold time interval; and
the data processing unit is further configured for:
determining whether the smart device has disconnected a physical connection in response to that the smart device monitoring unit determines that the smart device has disconnected from an access port;
recording the smart device as being offline in the data storage unit in response to that the smart device has disconnected the physical connection; and
updating the smart device as an ordinary online device in the data storage unit in response to that the smart device disconnected the wireless communication connection, but does not disconnect the physical connection.

4. The system according to claim 1, further comprising an ordinary device monitoring unit for monitoring an ordinary device and periodically reading each of the plurality of access ports of the energy switch to collect electrical information, which is used by the data processing unit to update the data storage unit.

5. The system according to claim 1, wherein:
the data storage unit comprises an online device list and a device information database;

the online device list stores real-time online information of the smart device and/or an ordinary device that is physically connected to the energy switch; and the device information database comprises online and offline records for a wireless communication of the smart device and energy management records for the smart device.

6. An intelligent monitoring method for an energy switch, comprising:

by a smart device monitoring unit:
   establishing a wireless communication connection between the energy switch and a smart device;
   receiving device electrical information from the smart device; and
   sending the device electrical information to a data processing unit; and by the data processing unit:
   checking each of a plurality of access ports of the energy switch to determine whether an access port of the plurality of access ports is physically connected to a device based on whether a current is detected in the access port;
   determining whether a data for the access port, in which the current is detected, has been updated within a threshold time period after the current is detected, the threshold time period being specifically set for the smart device;
   determining whether the current in the access port matches a rated current of the smart device in a case that the data for the access port has been updated within the threshold time period;
   determining that the device connected to the access port is the smart device in response to that the current in the access port matches the rated current of the smart device; and
   causing to update or store data in a data storage unit according to a result of the checking and the device electrical information.

7. The method according to claim 6, further comprising:
receiving, by the smart device monitoring unit, authentication information from the smart device and receiving the device electrical information in response to that the smart device passes the authentication, wherein the device electrical information comprises a device name, a rated voltage, a rated current, and information indicating whether energy management is required.

8. The method according to claim 6, further comprising:
receiving, by the smart device monitoring unit, a heartbeat message periodically from the smart device, and determining that the smart device has disconnected the wireless communication connection in response to that the heartbeat message has not been received after a threshold time interval;
determining, by the data processing unit, whether the smart device has disconnected from the access port in response to that it is determined that the smart device has disconnected the wireless communication connection;
recording, by the data processing unit, the smart device as being offline in the data storage unit in response to that it is determined that the smart device has disconnected from the access port; and
updating, by the data processing unit, the smart device as an ordinary online device in the data storage in response to that it is determined that the smart device disconnected the wireless communication connection, but does not disconnect from the access port.

9. The method according to claim 6, further comprising:
monitoring, by an ordinary device monitoring unit, an ordinary device and periodically reading each of the plurality of access ports to collect electrical information, which is used by the data processing unit to update the data storage unit.

\* \* \* \* \*